United States Patent
Zingg

(10) Patent No.: US 6,376,289 B1
(45) Date of Patent: *Apr. 23, 2002

(54) METHOD OF MANUFACTURING A SEMICONDUCTOR DEVICE

(75) Inventor: Rene P. Zingg, Nijmegen (NL)

(73) Assignee: U.S. Philips Corporation, New York, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/246,664

(22) Filed: Feb. 5, 1999

(30) Foreign Application Priority Data

Feb. 9, 1998 (EP) .............................. 98200396

(51) Int. Cl.⁷ ..................... H01L 21/00; H01L 21/84
(52) U.S. Cl. .................. 438/163; 438/289; 438/514
(58) Field of Search .................. 438/163, 289, 438/514; 148/DIG. 157

(56) References Cited

U.S. PATENT DOCUMENTS 5,300,448 A * 4/1994 Merchant

FOREIGN PATENT DOCUMENTS

EP  0497427 A2  5/1992 ......... H01L/29/784

OTHER PUBLICATIONS

Stever Merchant, "Arbitrary Lateral Diffusion Profiles", IEEE, vol. 42, No. 12, Dec. 1995, pp. 2226–2230.*

IEEE Transactions on Electron Devices, "Arbitrary Lateral Diffusion Profiles"; vol. 42, No. 12, Dec. 1995, pp. 2226–2230.

* cited by examiner

Primary Examiner—Long Pham
Assistant Examiner—Scott J. Hawranek
(74) Attorney, Agent, or Firm—Steven R. Biren

(57) ABSTRACT

The invention relates to a method of manufacturing a high-voltage element, in particular, but not exclusively an LDMOS transistor in SOI with a drift region (13) which has a linearly increasing doping concentration between a backgate region (8) and a drain (6). A doping mask (15) is used for doping the drift region, in which mask the pitch between the windows becomes smaller in the direction from source to drain at least within part of the drift region. This is achieved in an embodiment by means of windows which have identical dimensions but which lie closer together in proportion as they lie closer to the domain. It was found in experiments that a smooth doping profile can be obtained in this manner, so that peaks in the doping, and thus in the electric field, are avoided. The degree of impact ionization is reduced thereby, which benefits the robustness of the transistor.

8 Claims, 2 Drawing Sheets

METHOD OF MANUFACTURING A SEMICONDUCTOR DEVICE

FIELD OF THE INVENTION

The invention relates to a method of manufacturing a semiconductor device whereby a doping is provided in a semiconductor body through openings in a mask provided above a surface of the semiconductor body, whereupon a diffusion step is carried out such that the doping concentration in the semiconductor body rises in accordance with a desired profile in a lateral direction parallel to the surface.

BACKGROUND OF THE INVENTION

SUMMARY OF THE INVENTION

Such a method is known inter alia from the patent U.S. Pat. No. 5,300,448. This describes a high-voltage transistor of the lateral DMOS type (LDMOS) in a comparatively thin silicon layer, provided on a buried oxide layer which covers the surface of a silicon crystal. To obtain an optimum resurf condition with a uniform distribution of the electric field strength, the drift region of the transistor is given a doping profile in which the doping concentration increases linearly from the source to the drain. The manufacture of this doping profile is achieved by means of a doping mask provided with openings whose diameters increase in a direction from the source to the drain and which are situated at a substantially constant pitch. The desired linear doping profile is formed by means of a diffusion step at high temperature and of long duration. It was found that the electric field exhibits major fluctuations already in the case of comparatively small deviations in the envisaged doping profile. These fluctuations in the electric field may give rise to impact ionization and hot carrier degradation, so that the quality of the transistor is impaired. The invention has for its object in general to provide a doping method whereby a smoother doping profile can be obtained than by the known method. The invention further has for its object to provide a semiconductor device for use at high voltages wherein degradation owing to local peaks in the electric field strength is avoided as much as possible.

According to the invention, a method of the kind described in the opening paragraph is for this purpose characterized in that a mask is used for obtaining said profile whose pitch between openings becomes smaller in said lateral direction at least within part of the doping profile. It was found from experiments that peaks in the concentration in the eventual doping profile are at least substantially avoided, and thus also peaks in the electric field distribution.

A major embodiment of a method according to the invention is characterized in that a doping profile is formed which changes gradually between a minimum doping concentration at one side and a maximum doping concentration at an opposed, second side, for which purpose a doping mask is used with a first partial region corresponding to a portion of the doping profile in which the doping concentration is lower than half the difference between the maximum value and the minimum value, while at least the openings in the first partial region of the doping mask have at least substantially equal widths and are situated at variable distances from one another, seen in the direction of the doping profile. Advantageously, the openings in the first partial region may be manufactured so as to have the smallest dimensions which are possible in the process used, so that it is possible to adjust the local concentration over a wide range of doping concentrations by means of the concentration of mask openings. A further embodiment of a method according to the invention, whereby the concentration is adjusted by means of the density of mask openings also for higher doping concentrations, is characterized in that a second partial region has openings of varying widths, openings situated next to one another being separated from one another by portions of the mask material of at least substantially equal widths. Preferably, the masked portions between the mask openings in the second partial region are provided so as to have the smallest dimensions which are possible in the process.

The invention may be used to advantage in various types of semiconductor devices for obtaining a doping profile adapted to the specific device. Special advantages are obtained in the formation of the drift regions in high-voltage transistors. A preferred embodiment of a method according to the invention is characterized in that the transistor is of the lateral DMOS type, with a source zone, a drain zone, and a drift region of a first conductivity type and a back-gate region of the opposed, second conductivity type situated between the source zone and the drift region, the doping concentration in the drift region increasing in the direction from the source zone to the drain zone. The transistor may be formed in a surface layer of a first conductivity type which merges via a pn junction into a subjacent region or substrate of the second conductivity type. In this case the drift region is preferably given a doping profile in which the concentration rises in the direction from the source to the drain proportionally to the square root of the distance. An embodiment in which the doping profile rises linearly with this distance is characterized in that the semiconductor body is formed by a silicon layer which is provided on a substrate of electrically insulating material.

These and other aspects of the invention will be explained in more detail below with reference to an embodiment. In the drawing.

DETAILED DESCRIPTION OF THE PREFERRED EMBODIMENT

The invention is described with reference to a high-voltage lateral, doubly diffused MOS transistor, often referred to as LDMOST for short, but it will be obvious that the invention is also applicable to other high-voltage elements such as high-voltage diodes or transistors of the LIGBT type (lateral insulated gate bipolar transistors).

Figure 1:
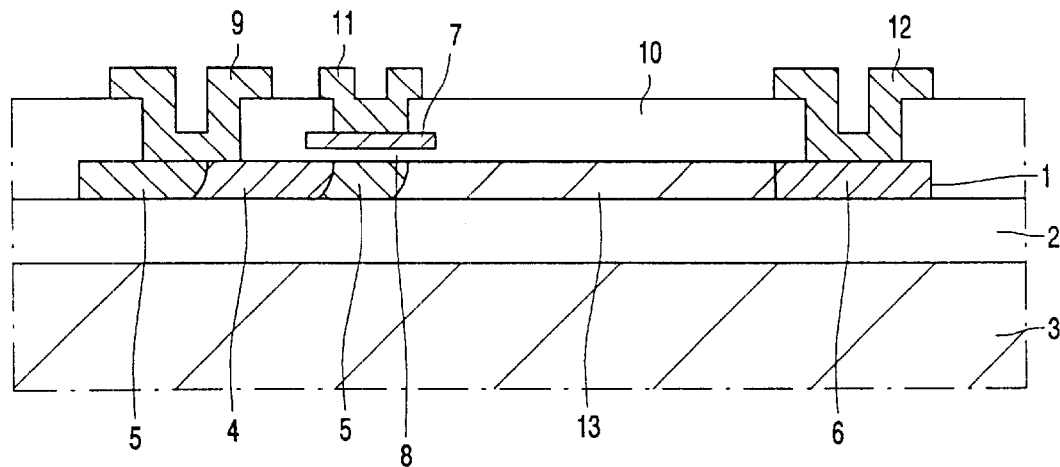
FIG. 1 is a cross-sectional view of an LDMOS transistor in the SOI technology, manufactured by a method according to the invention.

The transistor shown in FIG. 1 is constructed in the SOI technology (silicon on insulator) and comprises a comparatively thin silicon layer 1 on a substrate 2 of electrically insulating material. In the present example, the substrate 2 is formed by a layer of silicon oxide which covers the surface of a subjacent silicon body 3. The silicon layer 1 has a thickness, for example, of between 0.2 and 0.5 µm; the oxide layer 2 has a thickness, for example, of 3.0 µm. The invention is obviously not limited to these values, but alternative values may be chosen in dependence on specific circumstances. Other circuit elements may be provided in the silicon body 3, if so desired, for example an integrated circuit.

The transistor in this example is of the n-channel type and comprises an n-type source zone 4, a p-type back-gate region 5, and an n-type drain zone 6. The gate 7 is provided above the back-gate region 5 in which the channel of the transistor is defined, and is insulated from this channel by gate oxide 8. The gate 7 is made of doped polycrystalline silicon (poly), as is usual, but it may also be manufactured from an alternative suitable conducting material. The entire assembly is coated with an oxide layer 10 in which contact windows are provided at the areas of the source and drain zones and the gate. The source zone 4 is electrically connected to the p-type back-gate region 5 at the side facing away from the gate 7 by means of the metal contact 9 which short-circuits the pn junction between the two regions. The gate 7 and the drain zone 6 are connected to respective metal contacts 11 and 12. The contacts 9, 11 and 12 may be made, for example, of Al.

The back-gate region 22 and the drain zone 6 are separated from one another by an interposed high-ohmic region 13 which forms a drift region of the transistor in which a depletion region can be formed during operation in the case of a high voltage between the source 4 and the drain 6. The drift region is of the n-type in this example, but in an alternative embodiment it may also be of the p-type. The breakdown voltage of the transistor is determined inter alia by the length and the doping concentration of the drift region. As is indicated in the cited U.S. Pat. No. 5,300,448, a substantial improvement in the breakdown voltage can be obtained in that the drift region is given a doping profile in which the concentration rises linearly from the source to the drain. In the known method, the profile is manufactured through the use of a doping mask which has openings with diameters which become greater in a predetermined manner from the source to the drain.

Figure 2:
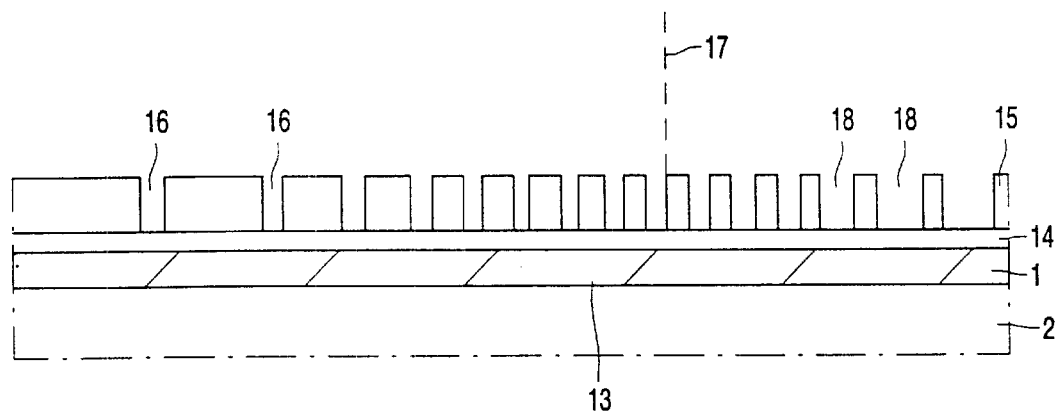
FIG. 2 is a cross-sectional view of this device during its manufacture.

It was found in practice that, although fairly smooth doping profiles can be obtained by the known method, nevertheless fluctuations often arise in the electric field which may cause impact ionization and hot-carrier degradation, so that the quality of the device may be impaired during operation. This disadvantage is at least substantially avoided through the use of a doping method according to the invention which leads to less strong fluctuations in the doping profile and thus in the electric field. FIG. 2 shows the device in at cross-section during its manufacture, with a doping mask 15 comprising a photoresist layer, in which openings 16, 18 are formed in a usual manner, being provided on the surface of the silicon layer 1 which is covered by a temporary oxide layer 14. It is noted that the drawing shows only the drift region 13 of the silicon layer 1. In the present example, the mask 15 comprises two regions, i.e. the region to the left of the line 17 where the average doping concentration is lower than 50% of the maximum doping concentration, and the region to the right of the line 17 where the average doping concentration is higher than 50% of the maximum concentration. The first region of the mask comprises openings 16 which have equal or at least substantially equal dimensions and which are arranged with mutual interspacings which decrease from the left to the right. The openings 16 are preferably given dimensions which are the minimum dimensions in the process used, which renders it possible to choose the density of openings as favorably as possible. In this example, the diameter of the openings 16 is approximately 1.5 $\mu$m. The pitch between the openings 16 decreases from left to right from approximately 10 $\mu$m adjacent the back-gate region 5 to approximately 1.5 $\mu$m adjacent the line 17. In the second region having higher doping concentrations, i.e. the region to the right of the line 17, the mask is provided with openings 18 which show an increasing diameter from left to right and which are mutually separated by interposed portions of the mask which have a fixed width, for example the smallest dimension possible in the process. The width of these mask portions is, for example, 1.5 $\mu$m. The dimensions of the openings 18 rise from the line 17, for example, in accordance with the progression 1.5 $\mu$m, 2 $\mu$m, 3 $\mu$m, . . . etc.

Figure 3:
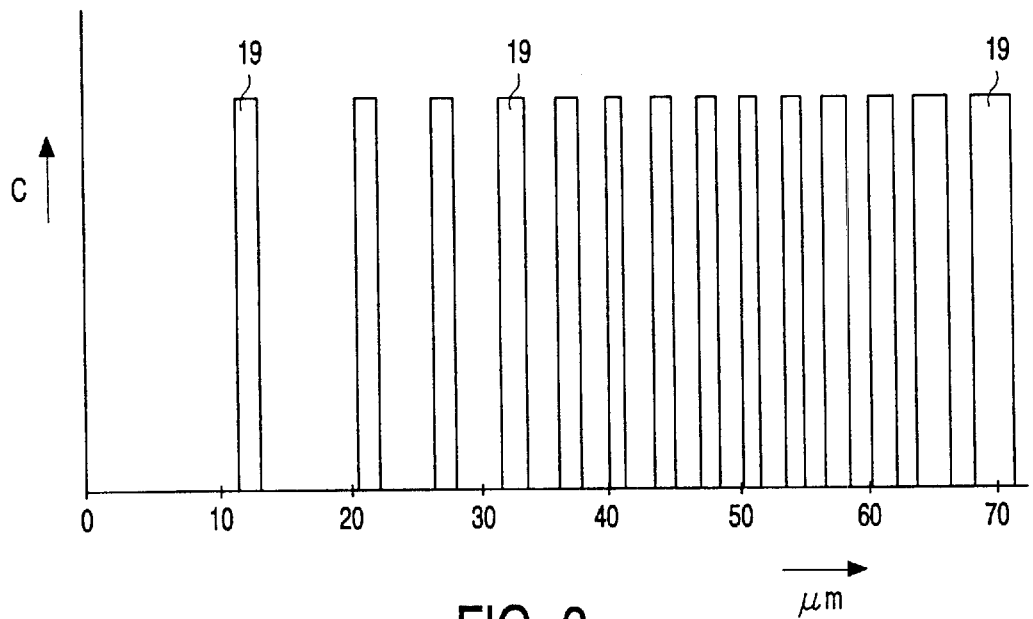
FIG. 3 shows the doping profile obtained in the drift region of this device through ion implantation during manufacture.

The silicon layer 1 is doped through the openings 16, 18 in the mask 15 with an n-type dopant, for example P ions which are provided in the layer 1 by implantation. The implantation dose is chosen to lie, for example, between $1*10^{13}$ and $2*10^{13}$ P ions per $cm^2$. Given a thickness of the silicon layer 1 of approximately 0.3 $\mu$m, this will lead to a doping concentration of between 3.5* and $7*10^{17}$ P atoms per $cm^3$, neglecting possible dopant loss into oxide layers. In stead of P, of course, also As ions could be used. However P is preferred because of its higher diffusivity. FIG. 3 shows the doping concentration after the implantation step in the form of the heights of the columns 19. The horizontal axis in the drawing indicates the position in the silicon layer (in $\mu$m).

Figure 4:
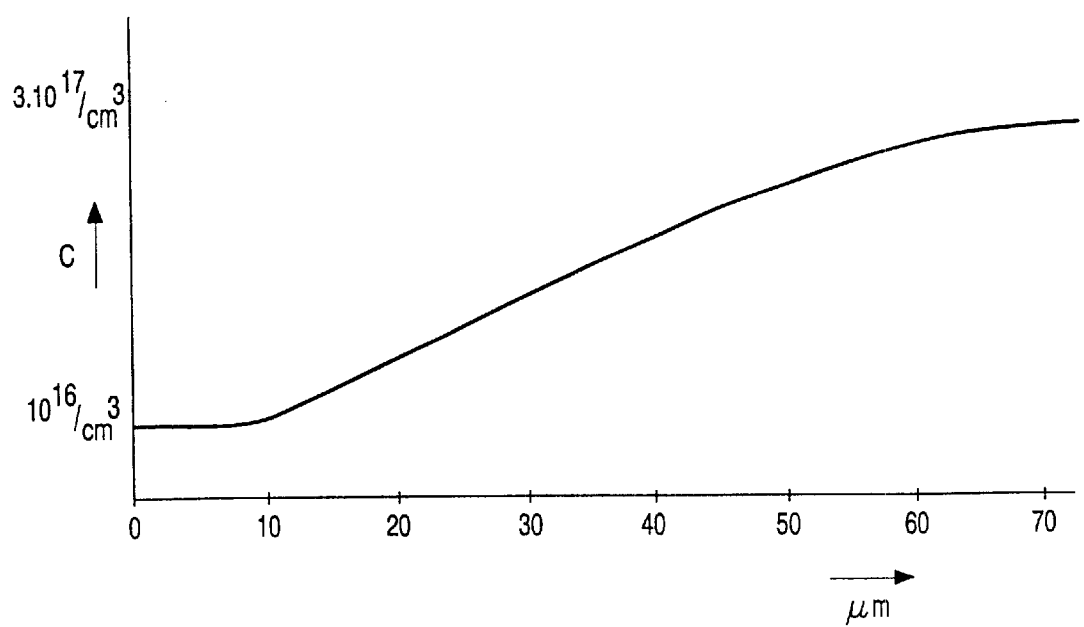
FIG. 4 shows the doping profile obtained after diffusion.

The mask 15 is removed after the implantation, and the device is subjected to a diffusion step of long duration, for example at 1100° C. during 36 hours. Local peaks in the doping concentration are at least substantially smoothed out by this diffusion step, and a practically linear doping profile is obtained as shown in FIG. 4. Comparative experiments have shown that the profile is considerably smoother than a profile manufactured by the known method with a mask having openings of different diameters and fixed pitch.

After the drift region has been manufactured, the device may be subjected to further necessary process steps which are known per se for making the back-gate region, the source and drain zones, the gate oxide with the gate, the oxide layer 10, and the metal contacts. Reference is made to the cited U.S. Pat. No. 5,300,448 for a more detailed description of these process steps.

Since the doping profile is comparatively smooth, the electric fields in the drift region are comparatively weak, which leads to a considerable reduction in the degree of impact ionization, and thus to an improvement in the robustness of the transistor. This advantage may obviously also be obtained in high-voltage elements other than transistors, such as diodes or LIGBTs.

In the example described here, the transistor is constructed in the SOI technology (silicon on insulator), in which a linear doping profile is desired. A doping profile is desired in which the concentration rises in accordance with the square root of the distance in other embodiments, in which the transistor is provided at the surface of a monocrystalline silicon substrate, and where the drift region is electrically insulated from the substrate by a cut-off pn junction. Such a doping profile may also be advantageously obtained through the use of a method according to the invention. It will furthermore be obvious that the invention is not limited to the embodiment described above, but that many more variations are possible to those skilled in the art within the scope of the invention. Thus the conductivity types of the example as described may be reversed. It is also possible to use other dielectric layers, such as silicon layers of different materials instead of oxide layers. In stead of silicon, a semiconductor body of SiC can be used.

What is claimed is:

1. A method of manufacturing a semiconductor device comprising:
    providing a doping in a semiconductor body through openings in a mask provided above a surface of the semiconductor body, and
    carrying out a diffusion step such that the doping concentration in the semiconductor body rises in accordance with a desired profile in a lateral direction parallel to the surface, using a mask for obtaining said profile wherein a sum of a width of a mask segment and an adjacent opening becomes smaller in said lateral direction at least within part of the doping profile, wherein a portion of the openings have substantially equal widths, and another portion of the openings have different widths.

2. A method as claimed in claim 1, characterized in that a doping profile is formed which changes gradually between a minimum doping concentration at one side and a maximum doping concentration at an opposed, second side, for which purpose a doping mask is used with a first partial region corresponding to a portion of the doping profile in which the doping concentration is lower than half the difference between the maximum value and the minimum value, while at least the openings in the first partial region of the doping mask have at least substantially equal widths and are situated at variable distances from one another, seen in the direction of the doping profile.

3. A method as claimed in claim 2, characterized in that a second partial region has openings of varying widths, openings situated next to one another being separated from one another by portions of the mask material of at least substantially equal widths.

4. A method as claimed in claim 3, characterized in that the doping profile is provided in the drift region of a high-voltage field effect transistor.

5. A method as claimed in claim 4, characterized in that the transistor is of the lateral DMOS type, with a source zone, a drain zone, and a drift region of a first conductivity type and a back-gate region of the opposed, second conductivity type situated between the source zone and the drift region, the doping concentration in the drift region increasing in the direction from the source zone to the drain zone.

6. A method as claimed in claim 5, characterized in that the semiconductor body is formed by a silicon layer which is provided on a substrate of electrically insulating material.

7. A method as claimed in claim 2, characterized in that the doping profile is provided in the drift region of a high-voltage field effect transistor.

8. A method as claimed in claim 1, characterized in that the doping profile is provided in the drift region of a high-voltage field effect transistor.

* * * * *